United States Patent [19]
Walowit et al.

[11] Patent Number: 5,179,408
[45] Date of Patent: Jan. 12, 1993

[54] MICROENCAPSULATED MEDIA SUPPLY AND UTILIZATION APPARATUS AND METHOD

[75] Inventors: Eric Walowit, Springboro; Gregory J. Sexton, Dayton, both of Ohio

[73] Assignee: The Mead Corporation, Dayton, Ohio

[21] Appl. No.: 583,631

[22] Filed: Sep. 17, 1990

Related U.S. Application Data

[63] Continuation-in-part of Ser. No. 446,367, Dec. 5, 1989, Pat. No. 5,015,277.

[51] Int. Cl.$^5$ .............................................. G03B 27/52
[52] U.S. Cl. .................................... 355/27; 430/138
[58] Field of Search ............... 355/27, 75, 100, 1 DL, 355/309, 321; 354/83-86; 430/138, 200

[56] References Cited

FOREIGN PATENT DOCUMENTS 63-266444 11/1988 Japan .

*Primary Examiner*—Michael L. Gellner
*Assistant Examiner*—D. Rutledge
*Attorney, Agent, or Firm*—Biebel & French

[57] ABSTRACT

Apparatus for utilizing microencapsulated media material includes a cartridge which contains a supply of the material, including a supply spool. The supply spool is wound as a two-layer sandwich which includes a donor web carrying the microencapsulated photosensitive material would in face-to-face relation with receiver material, in which the donor web forms the radial outer layer of the composite and the receiver material forms the radial inner layer. The donor web is formed with a clear base through which the photosensitive layer may be imaged, by drawing the composite from the spool past an exposure station formed as a slit in the cartridge. Thereafter, the composite is processed between a pair of developer rolls, one of which is formed as part of the cartridge. The donor web is then wound on a spool in the cartridge while the receiver material, carrying the image, is delivered from the cartridge. The receiver material may be glossed while it is within the cartridge by glosser apparatus contained within the cartridge. Additionally, the cartridge may contain means for treating the fumes of glossing.

5 Claims, 1 Drawing Sheet

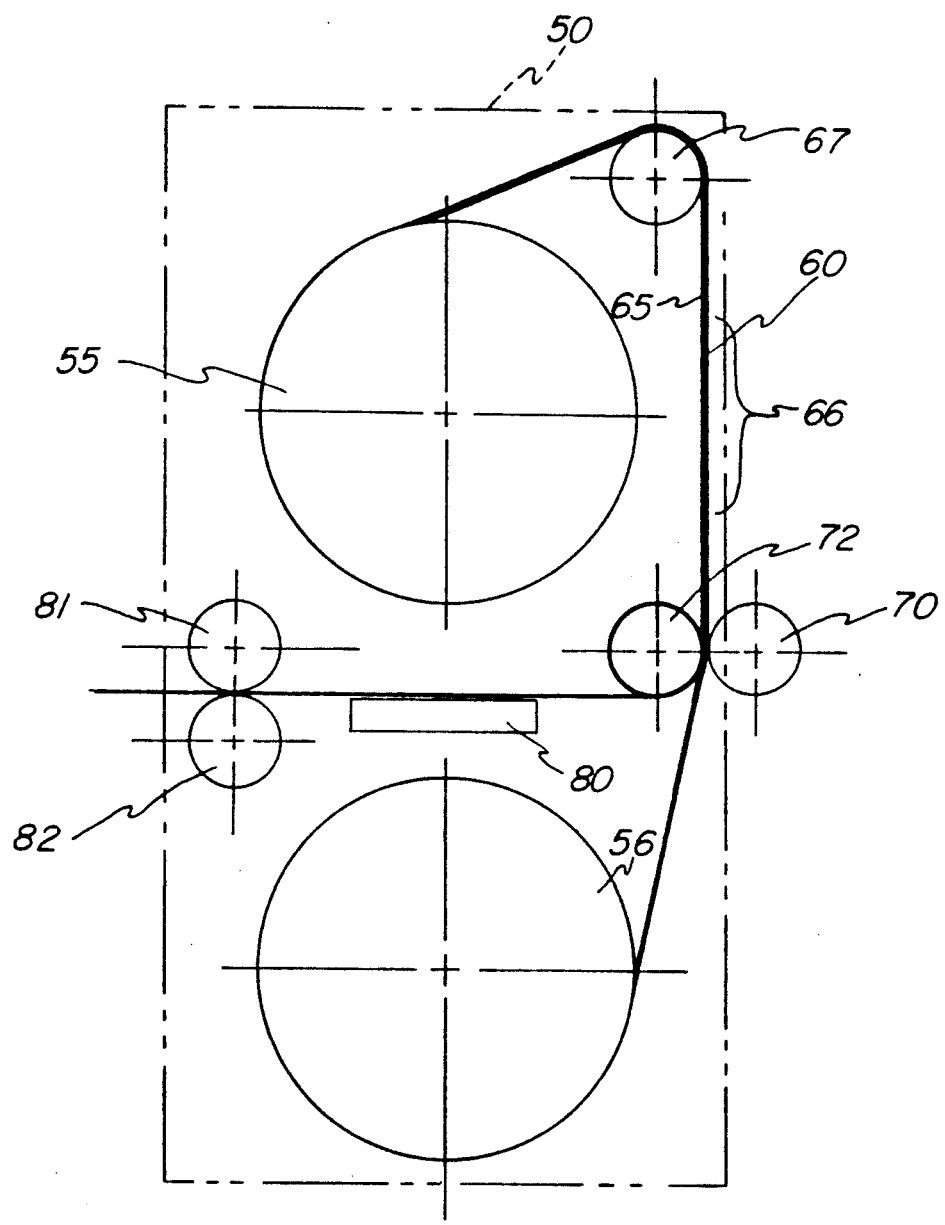

MICROENCAPSULATED MEDIA SUPPLY AND UTILIZATION APPARATUS AND METHOD

RELATED APPLICATION

This application is a continuation-in-part of application Ser. No. 446,367 filed Dec. 5, 1989 now U.S. Pat. No. 5,015,277.

BACKGROUND OF THE INVENTION

This invention relates to media material processing, and more particularly to a media cartridge or cassette and method for the imaging and utilization of microencapsulated media material, also known as cylithographic material.

Such media material, or several of such materials, may be supplied by a cartridge or cassette of such material to utilization apparatus, where the materials, which may be supplied in web form, are treated or acted upon such as by heat, light and/or pressure, to form images.

A need exists for utilization apparatus and a cartridge or cassette therefor, in which space is conserved by winding the donor and receiver webs together on a common spool for dispensing to the utilization apparatus, and for exposing such a composite web through a clear or transparent base of the donor web for subsequent development of the latent image.

SUMMARY OF THE INVENTION

Throughout this application, the term "cartridge" is intended to include either single or multiple spool containers, although the latter are more frequently referred to as cassettes. The media material, which is dispensed by the cartridge of this invention includes a donor web which has an imaging layer which includes a photosensitive microencapsulated layer made in accordance with the teachings of U.S. Pat. Nos. 4,440,846 and 4,399,209, 4,772,591 and 4,842,976, assigned to The Mead Corporation. The imaging media material as described in these patents, employs an imaging or donor web which includes a layer of microcapsules containing a photosensitive composition in the internal phase to the microcapsulates. Typically, this photosensitive composition is a photopolymerizable composition and a photoinitiator, and encapsuled with this composition is a color precursor.

Exposure image-wise selectively hardens the internal phase of the microcapsules, depending upon exposure and color sensitivity. Following exposure, the imaging web is "developed" by subjecting it to a uniform rupturing force by passing the donor web in contact with a resin coated developer/receiver web or sheet through the nip of a pair of pressure rollers, whereupon the color precursor is transformed to the receiver web, where it reacts with the resin layer of the receiver material to form an image. The substrate supports for the donor material, as well as the receiver material, may be a plastic film, such as a thin PET material, which may have a thickness of 0.5 mill, for example. Receiver/developer resins are disclosed in the above-listed U.S. patents. Additional examples of resins which are suitable for use as developer resins on the receiver web are also described in the co-pending U.S. application of Feldman et al, Ser. No. 467,094 filed Jan. 18, 1990, incorporated herein by reference.

The invention includes a cartridge which contains a supply of such media material wound on a supply spool. The spool contains a two-layer sandwich consisting of a donor web which has a microencapsulated photosensitive surface, as previously described. In a preferred embodiment this donor web is wound in face-to-face relation with a receiver web having a resin developer surface, as previously described. The donor web forms the radial outer layer of the composite while the receiver web or sheets form the radial inner layer, and the two layers are brought off together. Further, the donor web may be formed with a clear or transparent base through which the photosensitive layer may be imaged.

The cartridge of this invention has an exposure station which is defined by an exposure slit formed in the wall of the cartridge. The sandwich or two-layer material is withdrawn from the supply spool to and past the exposure slit, with the clear side of the base facing the slit for exposure of the photosensitive layer through the slit and through the transparent base material.

The improved cartridge of this invention provides one of the two developing rolls, which cooperates which a second roll provided by the utilization apparatus. Following pressure development, the spent donor web is wound, within the cartridge, on a take-up spool, and the receiver, with the image thereon, is delivered from the cartridge.

It is accordingly an object of this invention to provide apparatus for imaging and utilizing microencapsulated material in which a cartridge contains a supply of such material in the form of a two-layer sandwich including a donor web having a microencapsulated photosensitive surface wound in face-to-face relation with a receiver web or sheets.

Another object of the invention is the provision of a cartridge for microencapsulated photosensitive material, as defined above, which is imaged through a clear base at an exposure slit forming a part of the cartridge wall.

A further object of the invention is the provision of apparatus and method, as outlined above, in which a supply of imaging material having a photosensitive microencapsulated layer on a web-type base is wound in a two-layer sandwich, in face-to-face relation with a receiver web or sheets in which the receiver material is on the radial inside and the receiver web is on the radial outside, to form a composite, and in which the donor web is provided with a clear base, whereby the photosensitive layer may be imaged by exposure through the base and, preferably, through an exposure slit formed in the cartridge.

These and other objects and advantages of the invention will be apparent from the following description, the accompanying drawings and the appended claims.

BRIEF DESCRIPTION OF THE ACCOMPANY DRAWING

The FIGURE of the drawing is a side diagrammatic view of a cartridge in accordance with this invention, incorporating additional components utilized in the processing of web or sheet-type media materials.

DESCRIPTION OF PREFERRED EMBODIMENT

A feature of this invention is the incorporation, into a cartridge 50, of components which are usually contained in the utilization apparatus, within the replaceable cartridge or cassette 50, for periodic renewal, with a replacement of the cartridge, and for lowering the cost of the equipment involved. The cartridge 50 includes a spool 55 of media material and a take-up spool 56.

The delivery or supply spool 55 contains a sandwich of donor material 60 with a clear base, wound in face-to-face relation with a receiver web 65. The receiver 65 is carried on the inside surface of the donor so that the donor web 60 is on the radial outside surface and the receiver web 65 is on the radial inside surface. The sandwich accordingly contains a face down donor material 60 with a clear or transparent base. A face-up receiver web 65, in relation to the outer convolution of the material, is wound on the supply spool 55. While it is preferred to supply the receiver material in the form of a web, it is within the scope of this invention to incorporate the receiver as a series of individual sheets spaced along the donor web.

The sandwich of donor web material 60 and receiver material 65, contained in a single cartridge, provides several advantages. First, separate donor and receiver delivery means are not required, and thus the loading of the receiver material is performed simultaneously with the loading of the donor material. The donor web 60 may be easily exposed through the back side of the donor clear base, and a white receiver web 65 may be used to reflect back light to provide additional exposure.

An exposure station is diagrammatically illustrated at 66, which may take the form of an exposure slit in the wall of the cartridge 50. Alternatively, the composite web may be extracted from the cartridge 50 for exposure at an exposure station and returned to the cartridge.

In the cartridge of the drawing, the sandwich or composite is applied to developer rolls, including an external pressure roll 70 and an internal pressure roll 72. The external roll 70 is proportioned to engage the composite on the internal roll 72 through a suitable slot or opening formed in the case or the wall of the cartridge 50, and to apply the necessary developing pressure to the composite material which includes the webs 60 and 65.

Thereafter, the spent donor web 60 is taken up by the take-up means in the form of a spool 56, in the cartridge, while the receiver web 65 may pass through a chemical glosser 80 and through a pair of feed rolls 81, 82 to exit the cartridge. In addition to the component shown, an integrated filter system, formed integrally with the cartridge 50, may be employed in the manner shown in the parent application Ser. No. 446,376.

The cartridge 50 illustrates the economies which can be effected by incorporating additional processing components in the cartridge and tailoring such components to have a useful life commensurate with the quantity of material to be processed. For example, the developer pressure roll 72, integral and internal to the cartridge 50, is positioned to operate against a single external high quality developer pressure roll 70 of the utilization apparatus. Accordingly, the internal roll 72 need not be made of a high price material, and is designed to provide reliable operation only for the quantity of material within the cassette.

The internal chemical glosser 80 offers the advantage that the glossing fumes, if any, can be controlled and filtered at the source, and the glosser or glosser fumes treating means 80 need not have an effective capacity substantially in excess of the amount of material to be treated. Thus, by incorporating some of the critical apparatus components into the cartridge itself, the processing apparatus may be supplied at a substantially lower cost.

The cartridge 50 is provided with an internal web guide roller 67 which, together with the pressure developer defined by the developer roll 70 and 72, provide the means by which the composite web is drawn from the supply spool 55 past the exposure slit 66 for exposure of the photosensitive layer carried on the web 60 through the clear or transparent base of this material.

While the method herein described, and the form of apparatus for carrying this method into effect, constitute preferred embodiments of this invention, it is to be understood that the invention is not limited to this precise method and form of apparatus, and that changes may be made in either without departing from the scope of the invention, which is defined in the appended claims.

What is claimed is:

1. The method of imaging microencapsulated media material in which a donor web is provided with a photosensitive microencapsulated layer on a web-type base, and in which a receiver material is provided in the form of a resin surface layer supported on a web or sheet, comprising the steps of:
   providing the donor web with a clear base whereby the photosensitive layer may be imaged by exposure through the base,
   winding the donor web and the receiver material with the respective layers in face-to-face relationship with the donor web on the radial outside and the receiver material on the radial inside to form a composite,
   drawing such composite from a wound spool in a cartridge thereof and exposing the photosensitive layer through the transparent base of the donor web while in said cartridge,
   subjecting the composite to developing pressure by drawing the same through the nip of a pair of pressure rollers, and
   thereafter separating the donor web from the receiver material.

2. The method of claim 1 in which said receiver material has a white web to reflect back light to enhance the exposure of the photosensitive layer.

3. Apparatus for imaging and utilizing microencapsulated media material comprising:
   a cartridge containing a supply of such media material including a supply spool,
   said spool containing a wound supply of such media material in the form of a two-layer sandwich of a donor web having a microencapsulated photosensitive surface wound in face-to-face relation with receiver material in which the donor web is the radial outer layer and the receiver material is the radial inner layer, said donor web having a clear base through which the photosensitive layer may be imaged,
   an exposure station formed as an exposure slit in said cartridge,
   means drawing said sandwich from said supply spool to said exposure slit with the clear side of said base facing said slit for exposure of said photosensitive layer through said slit and said base,
   a developer station including a pair of pressure rolls receiving said sandwich from said exposure station for pressure development of the image on said donor web with said receiver web, a take-up means in said cartridge for receiving said donor web from said developer station, and means for receiving said receiver web from said developer station.

4. The apparatus of claim 3 in which one of said pair of pressure rolls is formed as an integral part of said cartridge.

5. In apparatus for imaging and utilizing microencapsulated media material, the improvement comprising:

a cartridge containing a supply of such media material including a spool, said spool containing a wound supply of such media material in the form of a two-layer sandwich of a donor web having a microencapsulated photosensitive surface wound in face-to-face relation with a receiver web or sheet in which the donor web is the radial outer layer and the receiver web or sheet is the radial inner layer, said donor web having a clear base through which the photosensitive layer may be imaged, said cartridge having a wall with means in said wall defining an exposure slit, means guiding said media material past said exposure slit with said clear base facing said slit for exposure of said donor web through said slit.

* * * * *